United States Patent [19]

Seese et al.

[11] 4,151,460

[45] Apr. 24, 1979

[54] HIGH RESISTANCE GROUND FAULT DETECTOR AND LOCATOR FOR POLYPHASE ELECTRICAL SYSTEMS

[75] Inventors: Daniel R. Seese, North Versailles; Alfred A. Regotti, Monroeville, both of Pa.

[73] Assignee: Westinghouse Electric Corp., Pittsburgh, Pa.

[21] Appl. No.: 838,263

[22] Filed: Sep. 30, 1977

[51] Int. Cl.² ............................................. G01R 31/08
[52] U.S. Cl. ......................................................... 324/52
[58] Field of Search ..................... 324/51, 52; 340/255; 361/42, 47, 58

[56] References Cited

U.S. PATENT DOCUMENTS

| | | | |
|---|---|---|---|
| 689,254 | 12/1901 | Varley | 324/52 |
| 2,466,079 | 4/1949 | Brunt | 324/52 |
| 2,641,633 | 6/1953 | Hosford | 324/52 |
| 3,031,613 | 4/1962 | Hojding | 324/52 |
| 3,343,080 | 9/1967 | Fox | 324/52 |
| 3,621,384 | 11/1971 | Yamada | 324/52 |
| 4,021,730 | 5/1977 | Brinegar | 324/52 |

FOREIGN PATENT DOCUMENTS 1390016  4/1975  United Kingdom ..................... 324/52

Primary Examiner—Gerard R. Strecker
Attorney, Agent, or Firm—M. J. Moran

[57] ABSTRACT

A ground fault detection system is taught which may be utilized on delta or wye connected polyphase electrical systems. The presence of a ground fault causes the neutral to ground voltage of a wye connected electrical system to increase to some value other than zero. Since a delta power system can be interconnected with a wye monitoring system to create an artifical neutral, a ground fault detector and pulsing arrangement can be provided between ground and the appropriate monitoring neutral. This system includes a coil which actuates a relay system which causes a first resistor to be alternately connected into and disconnected out of the ground current return path. The connection is made in parallel with a fixed resistor. This causes a change in the value of ground fault current with a given periodicity and frequency which in turn induces electromagnetic radiation around that path through which the ground fault current flows. This in turn allows for electromagnetic determination of the place where the ground fault occurs. In another embodiment of the invention, a broken delta secondary winding for a wye connected primary winding for a sensing transformer for a delta power system may be utilized in certain applications to modulate or pulse ground fault current.

9 Claims, 8 Drawing Figures

HIGH RESISTANCE GROUND FAULT DETECTOR AND LOCATOR FOR POLYPHASE ELECTRICAL SYSTEMS

BACKGROUND OF THE INVENTION

1. Field of the Invention

The subject matter of this invention relates generally to ground fault detecting systems and more particular to pulsating ground fault detection systems for polyphase electrical power distribution and transmission systems.

2. Description of the Prior Art

It is known to detect an electrical fault through the utilization of a transformer relay and an associated alarm in a ground line. Furthermore, the concept of utilizing a high resistance return line for ground fault current limiting purposes is known. Also, the broad concept of seeking the location of a ground fault is known. The broad concept of pulsing to detect faults is known as is shown in U.S. Pat. No. 2,721,307 issued to Bowels. Furthermore, U.S. Pat. No. 3,031,613, issued to Hojding shows a pulsing arrangement for a ground line in which a switch in the ground line is cyclically opened and closed to completely interrupt the ground fault current so that an operator can detect a ground fault in the system. In the Hojding case, however, a complete interruption of the ground fault current is necessary. In U.S. Pat. No. 3,343,080, issued to Fox, a ground fault system utilizing a broken delta in conjunction with pulsed serially connected resistors is taught for sensing ground fault current. The latter system teaches the use of an opened delta sensing transformer secondary winding. Other United States patents which teach concepts directly or indirectly related to ground fault detection, limitation and/or pulsing are as follows: U.S. Pat. Nos. 2,641,633 to Hosford, 3,287,636 to Gagniere, 3,230,424 to Gagniere, 3,176,219 to Behr, 2,403,414 to Traver, 2,400,749 to Foster. In addition, the following foreign patents disclose concepts of interest: British Patent Specification No. 923,292, German Pat. No. 1,144,839, and Norwegian Pat. No. 114,006. It would be advantageous if a current limiting pulsing-detector system could be provided which is basically the same for both delta and wye connected systems at both high and low voltages. Furthermore, it would be advantageous if the system were to utilize a pair of resistors, one of which would be permanently in place to limit current, and the other of which would be capable of being introduced in parallel with the first in an oscillatory or periodic manner so as to modulate or pulse the fault current. This would create detectable electromagnetic radiation in the line of the power system in which the ground fault current flows so that an indirectly connected detector could be utilized to determine the location of the fault current. This would be especially advantageous in high voltage situations where the system voltage may equal or exceed 2,400 volts.

SUMMARY OF THE INVENTION

In accordance with the invention, a universal fault detection system is taught in which a voltage sensitive coil and two resistive elements are connected in parallel between the neutral of a wye connected transformer and ground. In one case the wye connected transformer is the power transformer of the system to be monitored. In another case the wye connected transformer is a sensing transformer which is interconnected with a delta connected power transformer. The latter situation creates an artificial neutral which can be utilized for ground fault current sensing purposes. In high voltage cases the previously described resistive elements and coil element may be interconnected between the neutral and ground by way of a single phase transformer. Regardless of the system employed, it is recognized that a ground fault will provide a voltage imbalance in the power system being monitored. This introduces a voltage between the neutral of the wye transformer, be it the power system transformer itself or the monitoring transformer and ground. A voltage coil picks up the change in voltage and actuates a control system which causes one of the previously mentioned resistive elements to be periodically pulsed into and out of parallel connection with the other fixed resistive element. This of course changes the resistance in the path through which the fault current must be returned to the power system from which it is removed by way of the ground fault. Naturally a change of resistance causes a change in the value of ground fault current. The rate of change and the amount of change may be controlled by the control system and the values of resistance respectively. The net effect is to limit ground fault current in the first instance and to pulse the ground fault current so that a strong electromagnetic field is set up around the conductors of the power system on which the ground fault current flows in the second instance. By using an appropriate electromagnetic detection device such as, but not limited to, a current transformer, the location of the ground fault can be easily ascertained. For example, as the detection device is moved along the bus duct in which one of the ground faulted leads is contained it will respond to the oscillating ground fault current. This will continue with detector movement until the point of the ground fault is passed, in which case no further response to oscillatory current will be noted. In this way the pinpointing of the location of the ground fault is relatively easily accomplished.

BRIEF DESCRIPTION OF THE DRAWINGS

For a better understanding of the invention, reference may be had to the preferred embodiments thereof shown in the accompanying drawings in which.

DESCRIPTION OF THE PREFERRED EMBODIMENTS

Figure 1:
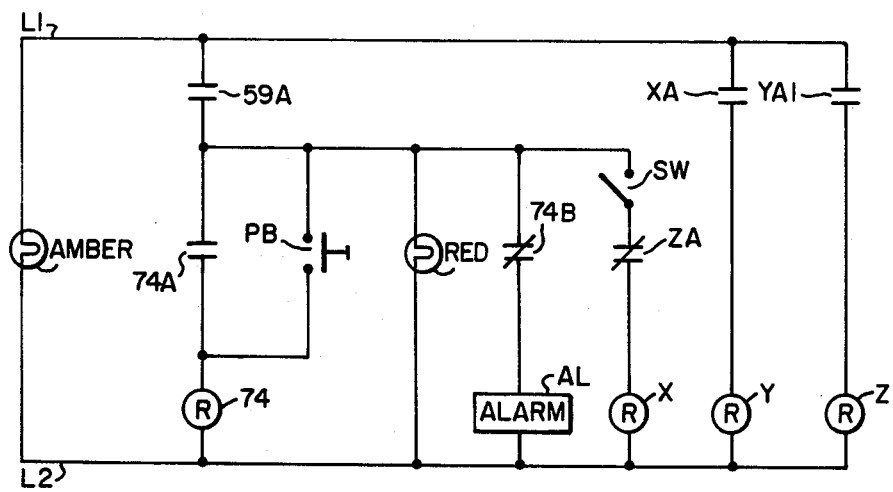
FIG. 1 shows a control system for a ground fault detecting system.

Referring now to the drawings and FIG. 1 in particular, an electromechanical control apparatus for controlling the pulsing of high or low voltage wye or delta connected electrical power transmission, distribution or utilization systems is shown. FIG. 1 shows an electromechanical control system for pulsing or alternately opening and closing a relay contact in accordance with a predetermined electrical stimulus. In particular, the apparatus of the control system of FIG. 1 may be fed or energized from two power supply lines L1 and L2 which may supply AC or DC power. In the preferred embodiment of the invention AC power is supplied. An AMBER light may be interconnected between the lines L1 and L2. The AMBER lamp will illuminate when an appropriate voltage is present between the lines L1 and L2 to empower the remaining portions of the control system of FIG. 1. Connected to the line L1 is one side of normally opened relay contacts 59A. The use of the actuating coil of contacts 59A will be described hereinafter with respect to other portions of the apparatus of this invention. Likewise, connected to the line L1 are one side each of normally opened relay contacts XA and YA1. The relay coil Y for contacts YA1 is connected to the other side of the contacts XA and to the other line L2. The relay coil X for the contacts XA is connected to one side of normally closed relay contacts ZA and to the line L2. The relay coil Z for the normally closed contacts ZA is connected to the other side of the contacts YA and to the line L2. The other side of the normally closed contacts ZA is connected to a switch SW. Connected to the other side of the relay contacts 59A are one side of a normally opened relay contact 74A, one side of a normally opened push button PB, one side of a RED indicating lamp, one side of a normally closed contact 74B and the other side of the switch SW. The other side of the relay contacts 74A is connected to the other side of the normally opened switch PB and to one side of a relay coil 74. The other side of the normally closed relay contacts 74B is connected to one side of an audio alarm AL. The other side of the coil 74, the lamp RED and the alarm AL are all connected to the line L2. The actual operation of the control apparatus of FIG. 1 will be described hereinafter with respect to the embodiments of the invention.

Figure 2:
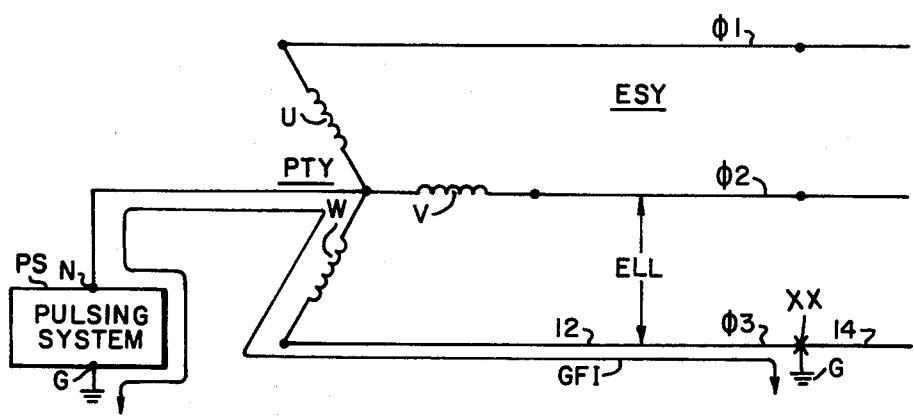
FIG. 2 shows a schematic diagram of a ground fault detection system for a wye connected power transformer.

Referring now to FIG. 2, a three phase electrical system ESY comprising the electrical lines or phases $\phi 1$, $\phi 2$ and $\phi 3$ is shown. The secondary winding of power transformer PTY for the three phase electrical system ESY comprises wye connected windings U, V and W. Winding U is connected at one end thereof to line $\phi 1$, winding V is connected at one end thereof to line $\phi 2$ and winding W is connected at one end thereof to line $\phi 3$. The other ends of each of the windings U, V and W are connected together in the traditional wye configuration to form a neutral N. There is also shown a ground plane G to which ground fault current GFI may flow. The ground fault current GFI in this instance is illustratively shown exiting the line $\phi 3$ at the point XX. Connected between the neutral N of the transformer winding PTY and ground G is a pulsing system PS. Normally the voltage between each of the lines $\phi 1$, $\phi 2$ and $\phi 3$ is ELL and normally the voltage between the neutral N of the transformer winding PTY and ground G is zero. However, if ground fault current GFI flows, the voltage distribution or arrangement shown in FIG. 2 will become unbalanced, thus introducing a voltage between the neutral N of the transformer PTY and ground G. This voltage may be utilized to actuate elements within the pulsing system PS as will be described hereinafter. Furthermore, the pulsing system PS cooperates with the remaining portion of the transformer winding PTY and the electrical system ESY to return the ground fault current GFI to the system PTY.

Figure 3:
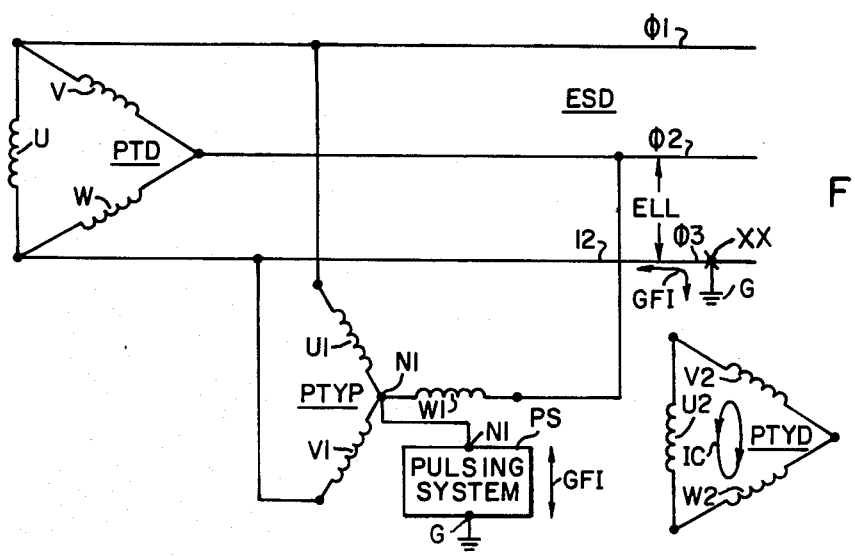
FIG. 3 shows a system for synthesizing an artificial neutral for a delta connected power transformer system.

Referring now to FIG. 3, another embodiment of the invention is shown in which an electrical power system ESD, which comprises a delta connected power transformer secondary winding PTD, is shown. In this case, the phase lines $\phi 1$, $\phi 2$ and $\phi 3$ are connected to the standard delta connections of the delta power transformer winding PTD. As was the case previously with respect to the secondary winding of the wye connected power transformer PTY of FIG. 2, the delta connected secondary winding of the transformer PTD of FIG. 3 comprises windings U, V and W. However, since a delta connected transformer has no inherent neutral, a synthesizing transformer primary winding PTYP is utilized to generate an artificial neutral N1. In this case, windings U1, V1 and W1 of the primary winding PTYP are connected to lines $\phi 1$, $\phi 3$ and $\phi 2$, respectively of the electrical power system ESD. In this case it is desirable to electrically interconnect the windings U2, V2 an W2 of the secondary winding PTYD in such a manner that a circulating current IC flows therethrough during normal operation. As was the case previously, should a ground fault current GFI exit the system ESD to the ground G at the point XX, it is forced to return to the synthesized neutral N1 of the primary winding PTYP of the synthesizing transformer through the pulsing system PS. The latter pulsing system PS is interconnected between the synthesized neutral N1 and ground G.

Figure 4:
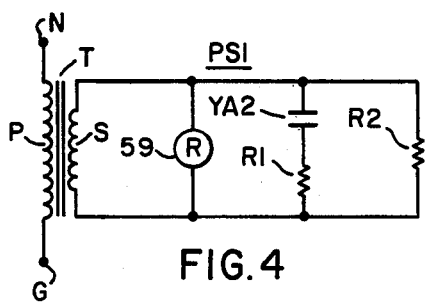
FIG. 4 shows an embodiment of the invention utilizing a transformer and a non-tapped fixed resistor.

Referring now to FIG. 4, an embodiment PSI of the pulsing system PS of the FIGS. 2 and 3 is shown. In this embodiment a single phase transformer T having a primary winding P and a secondary winding S is shown interconnected between the points N and G, it being understood that points N and G may represent points N and G of FIG. 2 or points N1 and G of FIG. 3, for example. Connected in parallel circuit relationship across the secondary winding S of the transformer T are an electromagnetic relay coil 59, which affects the operation of relay contacts 59A in the previously described control system of FIG. 1, a fixed resistor R2, and the series combination of a second resistor R1 and normally opened relay contacts YA2. The relay contacts YA2 are a second set of contacts for the coil Y of FIG. 1, it being remembered that the first set of contacts are designated YA1.

Figure 5:
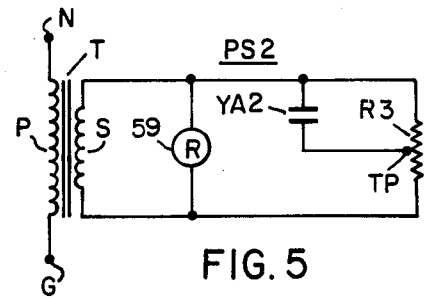
FIG. 5 shows an embodiment similar to that of FIG. 4 but for a tapped fixed resistor.

Referring now to FIG. 5, a second embodiment PS2 of the pulsing system PS is shown. In this case the transformer T with primary and secondary windings P and S respectively is shown once again connected between the points N and G. As was the case with respect to the embodiment of FIG. 4, a relay coil 59 is connected across the secondary winding S of the transformer T. In this embodiment of the invention, a tapped resistor or potentoimeter resistor R3 is utilized. The main terminals of the resistor R3 are connected across the secondary winding S and the tap or wiper terminal TP is connected to one side of normally opened relay contacts YA2, the other side of which is connected to one side of the secondary winding S of the transformer T.

Figure 6:
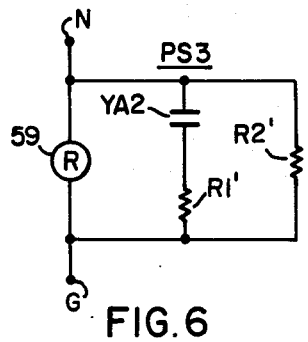
FIG. 6 shows an embodiment similar to that of FIG. 4 but without the transformer input circuit.

Referring now to FIG. 6, still another embodiment of the invention is shown which is similar to that shown in FIG. 4, except for the absence of the transformer T. This embodiment may be used in low voltage situations where the necessity of stepping down the voltage for the relay coil 59 and the relay contacts YA2, for example, is not necessitated. In this case, the relay coil 59 is connected directly between the points N and G and the resistive element R2' which generally corresponds the resistive element R2 of FIG. 4 is also connected between points N and G. As was the case with respect to the embodiment of FIG. 4, a second resistive element R1' is connected in series with the normally opened relay contacts YA2. The latter series combination is then connected between the points N and G as was the case with respect to the embodiment of FIG. 4.

Figure 7:
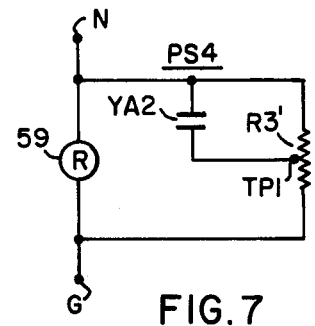
FIG. 7 shows an embodiment similar to that shown in FIG. 6 except for the utilization of a tapped fixed resistor.

Referring now to FIG. 7, a fourth embodiment PS4 for the pulsing system PS of FIG. 2 is shown and this embodiment is similar to the embodiment of FIG. 5 in that a tapped resistor or potentiometer R3' is utilized. This embodiment is also similar to the one of FIG. 6 in that no transformer T is required. Such being the case the relay coil 59 is connected between the points N and G and the resistive element R3' is connected thereacross. The normally opened relay contacts YA2 are connected between the point N and the tap point TP1 of the resistive element R3'.

With respect to the embodiments of FIGS. 4 and 5 taken in conjunction with FIGS. 2 and 3, it can be seen that ground fault current GFI must flow through the primary winding P of the transformer T. The resistive elements R2 or R3, as reflected from the secondary winding S to the primary winding P of the transformer T, will limit the full ground fault current GFI. At those times when the relay contacts YA2 are closed, an additional resistive element R1 is introduced in parallel with the resistive element R2 to decrease the current limiting action of the pulsing system PS1. In the case of pulsing system PS2 the portion of the resistive element R3 between the tap point TP and one side of the transformer secondary winding S is shorted out. In both cases the effect is to modulate or change the value of the ground fault current GFI flowing in the appropriate system.

Referring now to FIGS. 6 and 7, it can be seen that the operation of the pulsing systems PS3 and PS4 are essentially the same as the operation of the pulsing systems PS1 and PS2 respectively except that the resistive values R1' and R2' may be different than the resistive values R1 and R2 because of the absence of the transformer T. Likewise the resistive value R3' may be different than the resistive value R3 because of the absence of the transformer T. The embodiments PS3 and PS4 are best adapted for utilization with relatively low voltage systems, such as 600 volts or under.

Figure 8:
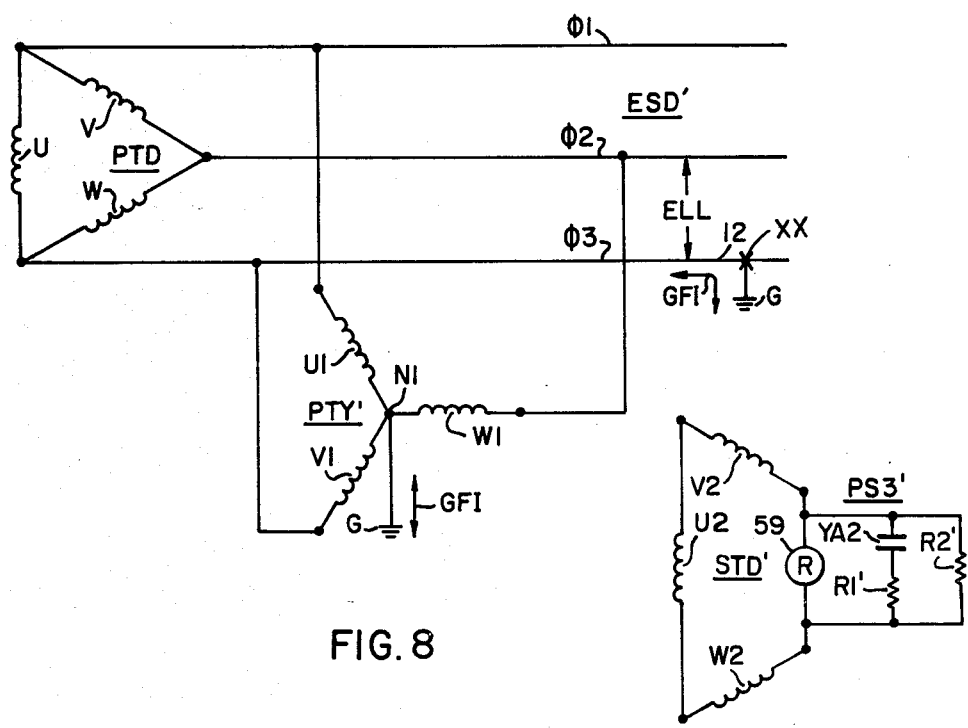
FIG. 8 shows a system similar to that shown in FIG. 3 in which ground fault detection and current limitation is accomplished by way of utilizing the broken delta secondary winding of a wye-delta sensing transformer arrangement similar to that shown in FIG. 3.

Referring now to FIG. 8, still another embodiment of the invention is shown. In this embodiment of the invention, a delta connected power transformer winding PTD with individual windings, U, V and W similar to the system ESD shown in FIG. 3 is utilized to provide a delta connected electrical distribution system ESD'. In this case, as was the case with respect to the embodiment of FIG. 3, a synthetic neutral N1 is formed by utilizing wye connected transformer primary windings PTY' which comprises the windings U1, V1, W1. The ground fault current GFI flows between ground G and the synthetic neutral N1. However, in this case, unlike the case with respect to the embodiment of FIG. 3, the delta secondary winding STD' is interconnected in a broken delta configuration. In this case there are windings U2, V2 and W2 with the windings V2 and W2 being broken to allow the insertion of a control limiting system PS3'. It will be noted that system PS3' is similar to system PS3 shown in FIG. 6, the difference being that the system is not interconnected between points N and G, as was the case with respect to the embodiment of FIG. 6. Rather, it is connected between the ends of windings V2 and W2.

OPERATION OF THE GROUND FAULT DETECTOR SYSTEM

Primarily, the power connection systems involved are embodied in FIGS. 2, 3 and 8. To be sepcific, FIG. 2 shows a wye connected primary system with a natural neutral N for an electrical power system ESY. On the other hand, FIG. 3 shows an electrical power system ESD which is delta connected. This system has no natural neutral connection thus necessitating the formation of a synthetic neutral N1. This is accomplished by the interconnection of a wye connected monitoring transformer primary PTYP (having a secondary winding PTYD for conducting circulating current IC) with the main system winding PTD. Finally, the delta connected system ESD' shown in FIG. 8 utilizes a broken delta secondary winding STD' for the synthetic neutral forming monitoring wye type primary transformer winding PTY'. With regard to the embodiments of FIGS. 2 and 3, the current detecting limiting systems shown in FIGS. 4–7 may be utilized for the pulsing systems PS shown in FIGS. 2 and 3. The embodiments of FIGS. 4 and 5 are primarily for higher voltage applications such as 2,400 volts, whereas the embodiments of FIGS. 6 and 7 are primarily for lower voltage application such as 600 volts and under. The embodiments of FIGS. 4 and 6 utilize the interconnection of parallel resistors (e.g. R1 and R2) for ground fault current modulation while the embodiments of FIGS. 5 and 7 introduce the shorting out of a series resistive element (e.g. R3) for ground fault current modulation. The relay coil 59, which is common to both the pulsing systems of FIGS. 4–7 and the control system of FIG. 1, senses the presence of ground fault current as it flows between the neutral N or N1 and the ground G and reacts accordingly to actuate the control system of FIG. 1. The energization of relay coil 59 of FIGS. 4–7 causes the normally opened relay contacts 59A of FIG. 1 to close, thus providing the line voltage of lines L1 and L2 to appropriate relay coils in the remaining portion of the control system of FIG. 1. It will be noted that the AMBER lamp is illuminated when voltage potential is present between the lines L1 and L2. This voltage is supplied by way of closed contacts 59A to the RED illuminating lamp to visually indicate that ground fault current is flowing. The normally closed contacts 74B provide power to the alarm AL thus giving an audible indication that ground fault current is flowing. At this point an operator may pulse the system to modulate the ground fault current GFI automatically by initially closing the switch SW. Since the normally closed relay contact ZA is connected in series with switch SW and with the relay coil X, the relay coil X becomes energized. This closes the contacts XA, which in turn allows energization of the relay coil Y, thus closing the contacts YA1 and YA2 of the embodiments of FIGS. 4–7 and FIG. 8. This also energizes the relay coil Z which opens the normally closed contacts ZA, which in turn causes the normally opened contacts XA to open, which in turn causes the now closed but normally opened contacts YA1 to open which in turn causes the relay contacts YA2 of FIGS. 4-7 and 8 to open which also causes the coil Z to be deenergized. This closes the normally closed contact ZA once again this completing a pulsing cycle. As can be seen, this operation continues as long as the switch SW is closed, thus alternately opening and closing the relay contacts YA2 and thus pulsing the ground fault currnt GFI as it flows between ground G and neutral N or N1 as the case may be. The modulated ground fault current GF1 will produce a modulated or varying electromagnetic field. By utilizing a current transformer or similar non-directly connected device (not shown) at a point 12, for example, in system ESY of FIG. 2, the presence of the ground fault current will be detected by the current transformer or similar sensing device. If the device is moved to point 14, for example, of FIG. 2, no electromagnetic radiation will be sensed because the ground fault current will have exited the system or otherwise passed to ground G at point XX. The utilization of the resistive elements R1, R2, etc. of FIGS. 4-7 and 8 limits the ground fault current GFI, thus protecting the various systems ESY, ESD and ESD' as the case may be. With regard to the embodiments of FIGS. 4, 6 and 8, it can be seen that the closing of the contacts YA2 places resistive elements R1 and R1', for example, in parallel with resistive elements R2 and R2' respectively, thus lowering the resistance path through which the ground fault current GFI flows, thus increasing the value thereof. It is to be understood, of course, that the value of ground fault current is nevertheless limited by the total parallel resistive effect. Opening the contacts YA2 once again increases the resistance, thus lowering the ground fault current GFI. It has been found that the oscillation rate of the relay contacts YA2 is determined primarily by the delay times of the relay coils X and Z. In the preferred embodiment of the invention these coils are set to be energized at approximately 1.5 second intervals, thus introducing a period of approximately 3 seconds for the modulation of the ground fault current GFI during a detecting operation. It will be noted with respect to the embodiments of FIGS. 5 and 7 that the closing of the contacts YA2 shorts out a portion of resistors R3 or R3' respectively which in turn lowers the total resistance between the points N and G thus increasing the ground fault current GFI. It will be also noted with respect to all the embodiments of FIGS. 4-7 and 8 that regardless of the range at which modulation is to take effect, the current GFI is generally maintained within safe limits. It is envisioned that by appropriately choosing the values of resistive elements in the various embodiments that the ground fault current GFI can be limited to 1, 3 or 5 amps during the lower current state and to 6, 8 or 10 amps respectively during the higher current state. This applies whether the voltage of the system is low voltage, i.e., below 600 volts or high voltage, i.e., up to 2,400 volts or higher.

Although the choice of values for the resistive elements R1, R2, R3 and R1', R2' and R3' respectively are virtually limitless, in preferred embodiments of the invention it has been found that certain resistive values are very useful. R1 or R1' may be 27.8 ohms, 55.4 ohms, 69.3 ohms and R2 may be 48 ohms, 98 ohms or 126 ohms. In other embodiments of the invention R2 may be 6.3 ohms whereas R1 may be 31 ohms. This latter situation is especially useful with respect to the embodiment of FIG. 8. Of course the latter embodiment is not limited to those values of resistance. In other embodiments of the invention, such as is shown in FIG. 4, the value of R1 may be 2.76 ohms and the total value of R2 may be 13.8 ohms. In the embodiment of the invention shown in FIG. 5 the value of resistance below the tap TP may be 1.4 ohms, whereas the total resistance of resistive element R3 may be 13.8 ohms. The same applies for the embodiment of FIG. 7. In a 4160 volt wye connected system such as shown in FIG. 5, the value of the resistive element R3 may be 2.4 ohms below the tap TP and 24 ohms total. In the embodiment of the invention shown in FIG. 3 the value of R1' may be 55 ohms while the value of R2' may be 277 ohms. In the embodiment of FIG. 7 the value of that part of the resistive element R3 below the tap point TP' may be 27 ohms while the entire resistive element R3 may equal 277 ohms.

It is to be understood with respect to the embodiments of this invention that the ground fault current shown flowing in phase 3 ($\phi3$) in most cases may flow in phase 1 ($\phi1$) or phase 2 ($\phi2$) or multiple phases at the same time. It is to be understood that the the turns ratio between the primary and secondary of the transformer T, for example, is only limited by the physical and electrical constraints and criteria of the systems and the desirable value of ground fault current. It is to be understood that the previously described values for resistances such as R1, R2, R3 and R1', R2' and R3' are not limiting in that other values may be chosen. It is also to be understood that although the invention is utilized primarily for ground fault detection through a ground fault modulation process, ground fault current limiting does take place concurrently therewith, thus giving the various systems the dual function of current limitation and ground fault detection. It is to be understood that the pulsing scheme outlined in FIG. 1 may be replaced by other forms of solid state or electromechanical relay pulse generating systems. Its function is primarily supportive to the concept of ground fault detection through modulation of ground fault current. It is to be understood with respect to the embodiment of FIG. 8 that it is not envisioned to use as a replacement for element PS3' thereof, the embodiment of FIG. 7, which is element PS4 as this is taught in the prior art. It is also to be understood that although representative operation of the concepts of the present invention is described with respect to the embodiment of FIG. 2, the embodiment of FIGS. 3 and 8 are associated with concepts which are essentially the same.

The apparatus taught with respect to the embodiments of this invention have many advantages. One advantage lies in the fact that the modulating techniques and apparatus taught herein provide not only effective current limiting but coordinated synergistic ground fault current pulsing or modulation which is highly desirable for the purpose of indirectly detecting the place, in a power system to be protected, at which ground fault current exits the power system and flows to ground. Another advantage lies in the fact the pulsing techniques taught do not require complete interruption of ground fault current, consequently the commutating problems associated therewith are not prevalent. It has been found that it is more easy to commutate relatively high values of current such as ground fault current from one limited value to another limited value rather than to completely interrupt the ground fault current. Another advantage lies in the use of the parallel resistors best shown in FIGS. 4 and 6. In this case the untimely loss of an entire resistive element such as R1 or R1' would not necessarily affect the current limiting property of the system as the resistive elements R2 and R2' respectively would be in place for current limiting. Likewise, loss of the resistive elements R2 or R2' would not necessitate the disastrous effects of completely unlimited ground fault current as the presence of ground fault current of significant magnitude will cause the relay contacts YA2 to be actuated by the relay coil 59, thus introducing some form of independent resistance into the circuit for ground fault limiting purposes. Another advantage lies in the fact that since the systems of FIG. 2 and FIG. 3 depend upon the interconnection of the ground fault sensing and pulsing system with the neutral of a wye connected transformer winding, interconnection is relatively simple and inexpensive.

What we claim as our invention is:

1. A ground fault detector for a three phase wye connected electrical power system, comprising:
   (a) voltage sensitive relay coil means connected between the neutral of said power system and ground, said relay coil means being actuated by the voltage which results between said neutral and said ground as a result of the flow of ground fault current;
   (b) control means electrically interconnected with the contacts of said relay coil means for alternately opening and closing another relay contact means at a predetermined frequency only when said relay coil means is actuated;
   (c) first resistive means interconnected between said neutral and ground in the return path of said ground fault current for limiting said ground fault current to a predetermined value; and
   (d) second resistive means interconnected in series circuit relationship with said another relay contact means, said series combination of said another relay contact means and said second resistive means being interconnected between said neutral and said ground in parallel circuit relationship with said first resistive means for changing the total resistance of said return path at said frequency for thus alternating the value of said ground fault current between said predetermined value and a higher value for thus providing alternating electromagnetic radiation in the vicinity of that part of said power system which carries said ground fault current for thus giving an indication of the location of said ground fault current.

2. A ground fault detector for a three phase wye connected electrical power system, comprising:
   (a) voltage sensitive relay coil means connected across the secondary winding of a single phase transformer, the primary of which is connected in the return path of said ground fault current between the neutral of said power system and ground, said relay coil means being actuated by the voltage which results between said neutral and said ground as a result of the flow of ground fault current;
   (b) control means electrically interconnected with the contacts of said relay coil means for alternately opening and closing another relay contact means at a predetermined frequency only when said relay coil means is actuated;
   (c) first resistive means connected across said secondary winding for limiting said ground fault current to a predetermined value; and
   (d) second resistive means interconnected in series circuit relationship with said another relay contact means, said series combination of said another relay contact means and said second resistive means being connected in parallel circuit relationship with said first resistive means for changing the total resistance of said return path at said frequency for thus alternating the value of said ground fault current between said predetermined value and a higher value for thus providing alternating electromagnetic radiation around that part of said power system which carries said ground fault current for thus giving an indication of the location of said ground fault current.

3. A ground fault detector for a three phase delta connected electrical power system, comprising:
   (a) a three phase wye connected transformer interconnected in phase by phase relationship with said delta connected electrical power system for establishing an artificial neutral for said delta connected electrical power system;
   (b) voltage sensitive relay coil means connected between said artificial neutral and ground, said relay coil means being actuated by the voltage which results between said artificial neutral and said ground as a result of the flow of ground fault current;
   (c) control means electrically interconnected with the contacts of said relay coil means for alternately opening and closing another relay contact means at a predetermined frequency only when said relay coil means is actuated;
   (d) first resistive means interconnected between said artificial neutral and ground in the return path of said ground fault current for limiting said ground fault current to a predetermined value; and
   (e) second resistive means interconnected in series circuit relationship with said another relay contact means, said series combination of said another relay contact means and said second resistive means being interconnected between said artificial neutral and ground in parallel circuit relationship with said first resistive means for changing the total resistance of said return path at said frequency for thus alternating the value of said ground fault current between said predetermined value and a higher value for thus providing alternating electromagnetic radiation in the vicinity of that part of said power system which carries said ground fault current for thus giving an indication of the location of said ground fault current.

4. A ground fault detector for a three phase delta connected electrical power system, comprising:
   (a) a three phase wye connected transformer connected in phase by phase relationship with said three phase delta connected electrical power system for establishing an artificial electrical neutral for said delta connected electrical power system;
   (b) voltage sensitive relay coil means connected across the secondary winding of a single phase transformer, the primary of which is connected in the return path of said ground fault current between said artificial neutral and said ground, said relay coil means being actuated by the voltage which results between said artificial neutral and said ground as a result of the flow of ground fault current;
   (c) control means electrically interconnected with the contacts of said relay coil means for alternately opening and closing another relay contact means at a predetermined frequency only when said relay coil means is actuated;

(d) first resistive means connected across said secondary winding for limiting said ground fault current to a predetermined value; and (e) second resistive means interconnected in series circuit relationship with said another relay contact means, and series combination of said another relay contact means and said second resistive means being connected in parallel circuit relationship with said first resistive means for alternately changing the total resistance of said return path at said frequency for thus alternating the value of said ground fault current between said predetermined value and a higher value for thus providing alternating electromagnetic radiation in the vicinity of that part of said power system which carries said ground fault current for thus giving an indication of the location of said ground fault current.

5. A ground fault detector for a three phase delta connected electrical power system, comprising:

(a) a three phase wye connected transformer, the windings of which are connected in phase by phase relationship with said delta power system and the secondary of which is connected in open delta configuration for providing a pair of terminals to which may be connected electrical apparatus;

(b) voltage sensitive relay coil means connected between said latter terminals, said relay coil means being actuated by the voltage which results across said latter terminals as a result of the flow of ground fault current;

(c) control means electrically interconnected with the contacts of said relay coil means for alternately opening and closing another relay contact means at a predetermined frequency only when said relay coil means is actuated;

(d) first resistive means interconnected between said latter terminals; and (e) second resistive means interconnected in series circuit relationship with said another relay contact means, said series combination of said another relay contact means and said second resistive means being connected across said latter terminals in parallel circuit relationship with said first resistive means for changing the resistance between said latter terminals at said frequency for thus alternating the value of said ground fault current for thus providing alternating electromagnetic radiation in the vicinity of that part of said power system which carries said ground fault current for thus giving an indication of the location of said ground fault current.

6. A ground fault detector for a three phase wye connected electrical power system, comprising:

(a) voltage sensitive relay coil means connected between the neutral of said power system and ground, said relay coil means being actuated by the voltage which results between said neutral and said ground as a result of the flow of ground fault current;

(b) control means electrically interconnected with the contacts of said relay coil means for alternately opening and closing another relay contact means at a predetermined frequency only when said relay coil means is actuated;

(c) first resistive means electrically disposed in the return path of said ground fault current for limiting said ground fault current to a predetermined value; and (d) second resistive means interconnected in parallel circuit relationship with said another relay contact means, said parallel combination of said another relay contact means and said second resistive means being interconnected in series circuit relationship with said first resistive means for changing the total resistance of said return path at said frequency for thus alternating the value of said ground fault current between said predetermined value and a higher value for thus providing alternating electromagnetic radiation in the vicinity of that part of said power system which carries said ground fault current for thus giving an indication of the location of said ground fault current.

7. A ground fault detector for a three phase wye connected electrical power system, comprising:

(a) voltage sensitive relay coil means connected across the secondary winding of a single phase transformer, the primary of which is connected in the return path of said ground fault current between the neutral of said power system and ground, said relay coil means being actuated by the voltage which results between said neutral and said ground as a result of the flow of ground fault current;

(b) control means electrically interconnected with the contacts of said relay coil means for alternately opening and closing another relay contact means at a predetermined frequency only when said relay coil means is actuated;

(c) first resistive means connected in circuit relationship with said secondary winding for limiting said ground fault current to a predetermined value; and (d) second resistive means interconnected in parallel circuit relationship with said another relay contact means, said parallel combination of said another relay contact means and said second resistive means being connected in series circuit relationship with said first resistive means across said secondary winding for changing the total resistance of said return path at said frequency for thus alternating the value of said ground fault current between said predetermined value and a higher value for thus providing alternating electromagnetic radiation around that part of said power system which carries said ground fault current for thus giving an indication of the location of said ground fault current.

8. A ground fault detector for a three phase delta connected electrical power system, comprising:

(a) a three phase wye connected transformer interconnected in phase by phase relationship with said delta connected electrical power system for establishing an artificial neutral for said delta connected electrical power system;

(b) voltage sensitive relay coil means connected between said artificial neutral and ground, said relay coil means being actuated by the voltage which results between said artificial neutral and said ground as a result of the flow of ground fault current;

(c) control means electrically interconnected with the contacts of said relay coil means for alternately opening and closing another relay contact means at a predetermined frequency only when said relay coil means is actuated;

(d) first resistive means electrically disposed between said artificial neutral and ground in the return path of said ground fault current for limiting said ground fault current to a predetermined value; and (e) second resistive means interconnected in parallel circuit relationship with said another relay contact means, said parallel combination of said another relay contact means and said second resistive means being interconnected in series circuit relationship with said first resistive means for changing the total resistance of said return path at said frequency for thus alternating the value of said ground fault current between said predetermined value and a higher value for thus providing alternating electromagnetic radiation in the vicinity of that part of said power system which carries said ground fault current for thus giving an indication of the location of said ground fault current.

9. A ground fault detector for a three phase delta connected electrical power system, comprising:

(a) a three phase wye connected transformer connected in phase by phase relationship with said three phase delta connected electrical power system for establishing an artificial electrical neutral for said delta power system;

(b) voltage sensitive relay coil means connected across the secondary winding of a single phase transformer, the primary of which is connected in the return path of said ground fault current between said artificial neutral and said ground, said relay coil means being actuated by the voltage which results between said artificial neutral and said ground as a result of the flow of ground fault current;

(c) control means electrically interconnected with the contacts of said relay coil means for alternately opening and closing another relay contact means at a predetermined frequency only when said relay coil means is actuated;

(d) first resistive means connected in circuit relationship with said secondary winding for limiting said ground fault current to a predetermined value; and (e) second resistive means interconnected in parallel circuit relationship with said another relay contact means, said parallel combination of said another relay contact means and said second resistive means being connected in series circuit relationship with said first resistive means across said secondary winding for changing the total resistance of said return path at said frequency for thus alternating the value of said ground fault current between said predetermined value and a higher value for thus providing alternating electromagnetic radiation in the vicinity of that part of said power system which carries said ground fault current for thus giving an indication of the location of said ground fault current.

* * * * *